(12) United States Patent
Koduri et al.

(10) Patent No.: US 11,177,195 B2
(45) Date of Patent: Nov. 16, 2021

(54) MULTI-LEAD ADAPTER

(71) Applicant: TEXAS INSTRUMENTS INCORPORATED, Dallas, TX (US)

(72) Inventors: Sreenivasan K. Koduri, Allen, TX (US); Abram M. Castro, Carrollton, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/394,564

(22) Filed: Apr. 25, 2019

(65) Prior Publication Data

US 2020/0343165 A1    Oct. 29, 2020

(51) Int. Cl.
*H01L 23/495* (2006.01)
*H01L 23/50* (2006.01)

(52) U.S. Cl.
CPC ........ *H01L 23/49541* (2013.01); *H01L 23/50* (2013.01); *H01L 2224/48247* (2013.01)

(58) Field of Classification Search
CPC ............................ H01L 23/49541; H01L 23/50
See application file for complete search history.

(56) References Cited

U.S. PATENT DOCUMENTS

| | | | | |
|---|---|---|---|---|
| 3,902,148 A * | 8/1975 | Drees | ................. | H01L 21/4842 257/669 |
| 9,496,208 B1 * | 11/2016 | Ostrowicki | ....... | H01L 23/49541 |
| 9,601,419 B1 * | 3/2017 | Toong | ..................... | H01L 25/50 |
| 9,721,881 B1 * | 8/2017 | Gong | ................ | H01L 23/49827 |
| 2002/0135982 A1 * | 9/2002 | Kledzik | ................ | H01L 25/105 361/704 |
| 2007/0096160 A1 * | 5/2007 | Beroz | ................. | H01L 25/0652 257/232 |
| 2009/0229872 A1 * | 9/2009 | Takaike | ................ | H05K 1/023 174/261 |
| 2009/0230531 A1 * | 9/2009 | Do | .......................... | H01L 25/50 257/685 |
| 2010/0091472 A1 * | 4/2010 | Kummerl | ......... | H01L 23/49541 361/772 |
| 2013/0328216 A1 * | 12/2013 | Jin | ........................ | H01L 25/105 257/777 |
| 2014/0091428 A1 * | 4/2014 | Hossain | .................. | H01L 28/60 257/532 |
| 2014/0191378 A1 * | 7/2014 | Lee | ..................... | H01L 23/49531 257/668 |
| 2014/0273344 A1 * | 9/2014 | Terrill | ................. | H01L 21/4853 438/107 |
| 2015/0171934 A1 * | 6/2015 | Brauchler | ......... | H01L 23/49822 455/41.1 |
| 2015/0200162 A1 * | 7/2015 | Constantino | ...... | H01L 23/49537 257/532 |

(Continued)

*Primary Examiner* — Nathan W Ha
(74) *Attorney, Agent, or Firm* — Dawn Jos; Charles A. Brill; Frank D. Cimino

(57) ABSTRACT

In some examples, a device comprises an electronic component having multiple electrical connectors, the multiple electrical connectors configured to couple to a printed circuit board (PCB) and having a first footprint. The device also comprises a multi-lead adapter comprising multiple rows of leads arranged in parallel, the leads in the rows configured to couple to the electrical connectors of the electronic component and having a second footprint that has a different size than the first footprint.

19 Claims, 11 Drawing Sheets

(56) References Cited

U.S. PATENT DOCUMENTS

| | | | |
|---|---|---|---|
| 2016/0111346 A1* | 4/2016 | Hoeglauer | H01L 23/4952 |
| | | | 257/685 |
| 2016/0260656 A1* | 9/2016 | Hwang | H01L 23/49861 |
| 2016/0372404 A1* | 12/2016 | Sun | H01L 21/561 |
| 2018/0158804 A1* | 6/2018 | Martin | H01L 25/18 |
| 2019/0277703 A1* | 9/2019 | Valouch | H01L 31/02966 |
| 2020/0135626 A1* | 4/2020 | Yong | H01L 24/11 |

* cited by examiner

MULTI-LEAD ADAPTER

SUMMARY

In some examples, a device comprises an electronic component having multiple electrical connectors, the multiple electrical connectors configured to couple to a printed circuit board (PCB) and having a first footprint. The device also comprises a multi-lead adapter comprising multiple rows of leads arranged in parallel, the leads in the rows configured to couple to the electrical connectors of the electronic component and having a second footprint that has a different size than the first footprint.

In some examples, a device comprises a package including a first group of leads extending from the package and a die coupled to the first group of leads, the first group of leads forming a footprint smaller than that of a small outline integrated circuit (SOIC) package. The device also comprises a second group of leads coupled to the first group of leads, the second group of leads forming another footprint that is consistent with that of an SOIC package.

In some examples, a package comprises a device including a first group of leads extending from a first side of the device and a second group of leads extending from a second side of the device opposite the first side of the device. The package also comprises a third group of leads coupled to the first group of leads, and a fourth group of leads coupled to the second group of leads. A first distance between ends of the first group of leads and corresponding ends of the second group of leads is different than a second distance between ends of the third group of leads and corresponding ends of the fourth group of leads.

BRIEF DESCRIPTION OF THE DRAWINGS

For a detailed description of various examples, reference will now be made to the accompanying drawings in which.

DETAILED DESCRIPTION

Various types of circuitry, such as integrated circuits, are fabricated on semiconductor dies. These dies are subsequently electrically connected to a leadframe. A die, leads of the leadframe, and the connections between the two are then encapsulated using a molding material, e.g., an epoxy. The finished device, including the die, multiple leads, electrical connections, and molding is referred to as a "package" or a "chip package."

With technological improvements, packages continue to decrease in size. These decreases in size are welcome in some industries, such as the telecommunications industry, where decreased device (e.g., smartphone) size is desirable. However, in many industries, the benefits obtained by decreases in package size are outweighed by the difficulties introduced by such decreases in package size. For example, in the automotive industry, a decrease in package size results in the need to re-design the parts of a vehicle that connect to the package. Such efforts are expensive and time-consuming, and in many industries it would be preferable to simply maintain a standard package size for the foreseeable future, even when smaller package sizes are available. The semiconductor industry, however, continues to introduce smaller package sizes.

This disclosure describes a multi-lead adapter that enables small packages to be physically compatible with systems designed to connect to larger packages. The multi-lead adapter comprises multiple leads that are physically arranged and shaped so that first ends of the leads are compatible with small packages and second ends of the leads are compatible with systems designed to connect to larger packages. In this way, a package of virtually any size can be made retroactively compatible with systems designed to connect to older, larger packages (e.g., small outline integrated circuit (SOIC)). The concept as described in this disclosure is extended beyond small packages to include any suitable device, such as printed circuit boards (PCB), sensors, passive electronic components, meters, and more. Advantages produced by the disclosed multi-lead adapter include reduced financial and sunk time costs, since the need to re-design systems to accommodate smaller, newer packages is eliminated.

Figure 1:
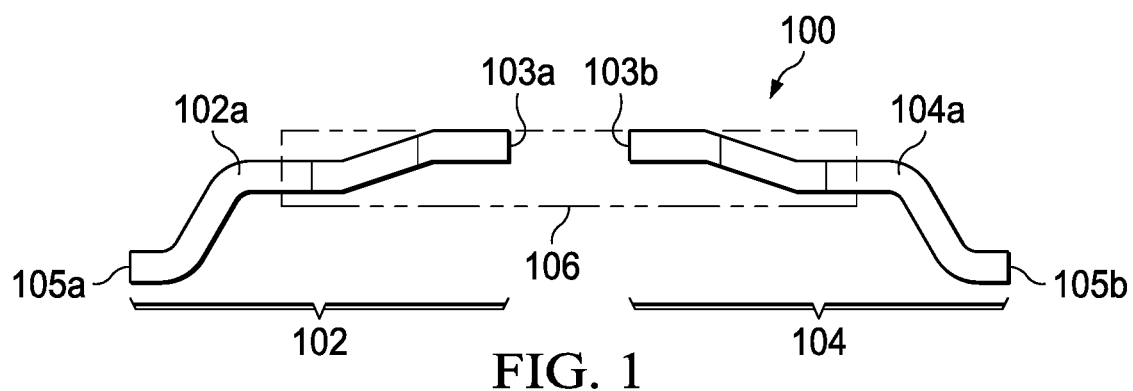
FIG. 1 depicts a front view of a multi-lead adapter, in accordance with examples.
Figure 2:
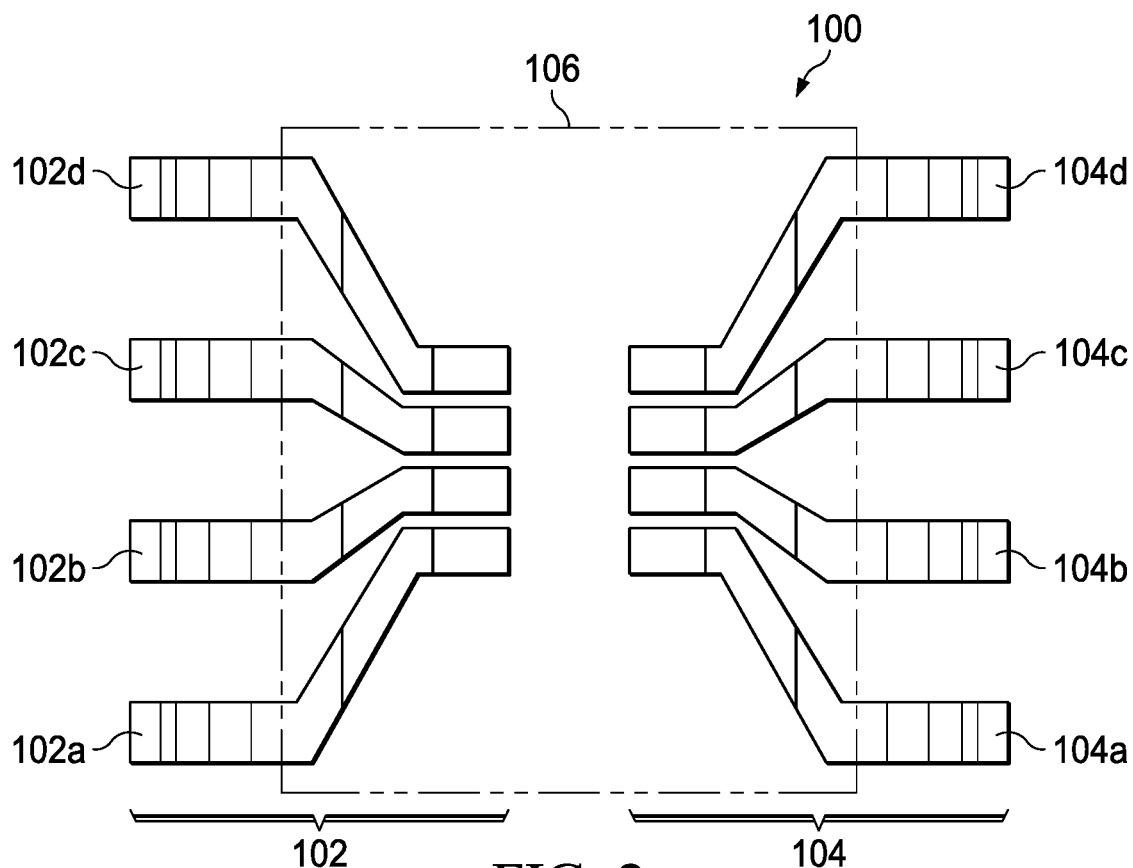
FIG. 2 depicts a top-down view of a multi-lead adapter, in accordance with examples.
Figure 3:
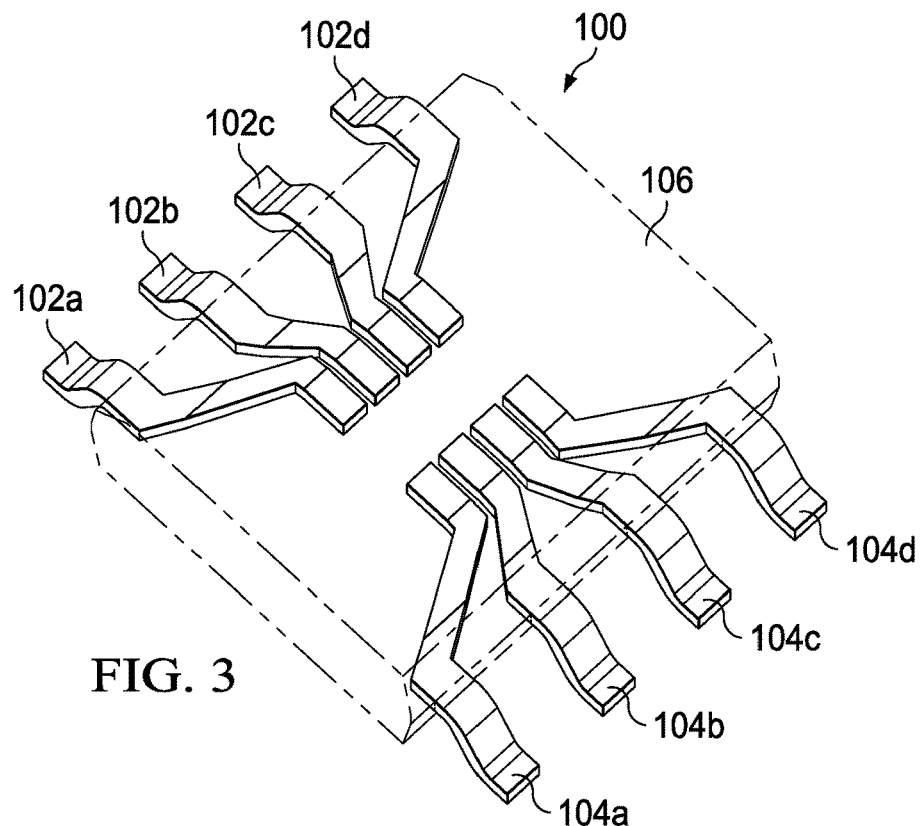
FIG. 3 is a perspective view of a multi-lead adapter, in accordance with examples.

FIG. 1 depicts a front view of a multi-lead adapter 100, in accordance with examples. The multi-lead adapter 100 is made of any suitable conductive material, such as a metal or metal alloy. In some examples, the multi-lead adapter 100 is manufactured by a stamping process performed on a sheet of metal or metal alloy. As described with respect to other figures below, the multi-lead adapter 100 includes multiple leads, two of which are visible in the front view of FIG. 1 (leads 102a and 104a). The leads 102a and 104a have ends 103a, 103b that face each other, as well as opposing ends 105a and 105b. The leads, including leads 102a and 104a, are shaped, sized, and positioned such that the ends 103a, 103b are suitable for electrically coupling to a package or device with a relatively small footprint (e.g., smaller than an SOIC footprint), and such that the ends 105a, 105b have a footprint matching a predetermined specification (e.g., SOIC, plastic dual in-line package (PDIP), thin shrink small outline package (TSSOP), micro small outline package (MSOP), and others). (A "footprint" is the distance between the distal ends of any two parallel leads in a parallel-lead configuration.) In this way, a package or device that does not have the footprint created by ends 105a, 105b is still able to electrically couple to devices (e.g., PCBs) that are specifically designed to couple to the footprint created by ends 105a, 105b. For example, if the footprint created by ends 105a, 105b is an SOIC footprint, then the multi-lead adapter 100 enables non-SOIC packages and devices to couple to devices (e.g., PCBs) that only accept packages or devices with SOIC footprints. In some examples, the multi-lead adapter 100 includes a non-conductive platform 106, for example composed of epoxy molding. (The non-conductive platform 106 is depicted in FIGS. 1-3 as being transparent to provide a view of the contents of the non-conductive platform 106.) In some examples, the non-conductive platform 106 is a rectangular prism, although the scope of this disclosure is not limited as such. The non-conductive platform 106 is useful, for example, to provide mechanical stability to support a package or device that is mounted on the non-conductive platform 106. However, the non-conductive platform 106 is optional and, in some examples, is omitted.

FIG. 2 depicts a top-down view of the multi-lead adapter 100, in accordance with examples. The multi-lead adapter 100 includes a row of leads 102 and another row of leads 104. As shown, row of leads 102 includes leads 102a, 102b, 102c, and 102d, and row of leads 104 includes leads 104a, 104b, 104c, and 104d. The shapes, sizes, and positions of the leads in FIG. 2 are merely illustrative. The concept described herein may be extended to any shape, size, and position of one or more leads in a multi-lead adapter. The optional non-conductive platform 106 is also depicted. The size, shape, and position of the non-conductive platform 106 may vary.

FIG. 3 is a perspective view of the multi-lead adapter 100, in accordance with examples. The multi-lead adapter 100 includes the leads 102a-102d and 104a-104d depicted in FIG. 2 and described above. In addition, in examples, the multi-lead adapter 100 includes the optional non-conductive platform 106.

Figure 4:
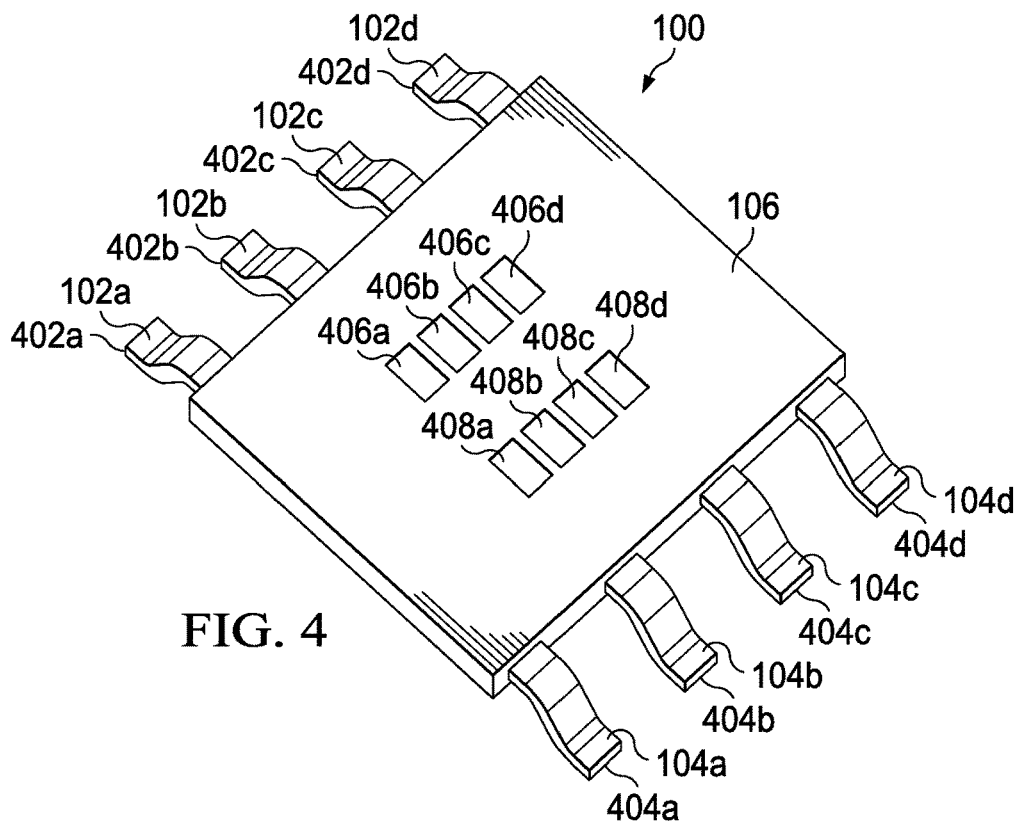
FIG. 4 is a perspective view of a multi-lead adapter with a non-conductive platform, in accordance with examples.

FIG. 4 is a perspective view of the multi-lead adapter 100, in accordance with examples. The drawing of FIG. 4 differs from that of FIG. 3 in that the non-conductive platform 106 is opaque, whereas in FIG. 3, the non-conductive platform 106 is shown as being transparent. An opaque rendering is provided in FIG. 3 to depict the exterior features of the non-conductive platform 106—namely, the lead ends 406a-406d and 408a-408d that are exposed to a top surface of the non-conductive platform 106 via a plurality of orifices, as well as the fact that the non-conductive platform 106 encapsulates at least part of each of the leads 102a-102d and 104a-104d. The degree to which the non-conductive platform 106 encapsulates the leads varies, as long as the ends 402a-402d and 404a-404d are exposed. The shape, spacing, and positioning of the ends 406a-406d and 408a-408d may vary and depends on the footprint of the package or device to be mounted on the non-conductive platform 106.

Figure 5:
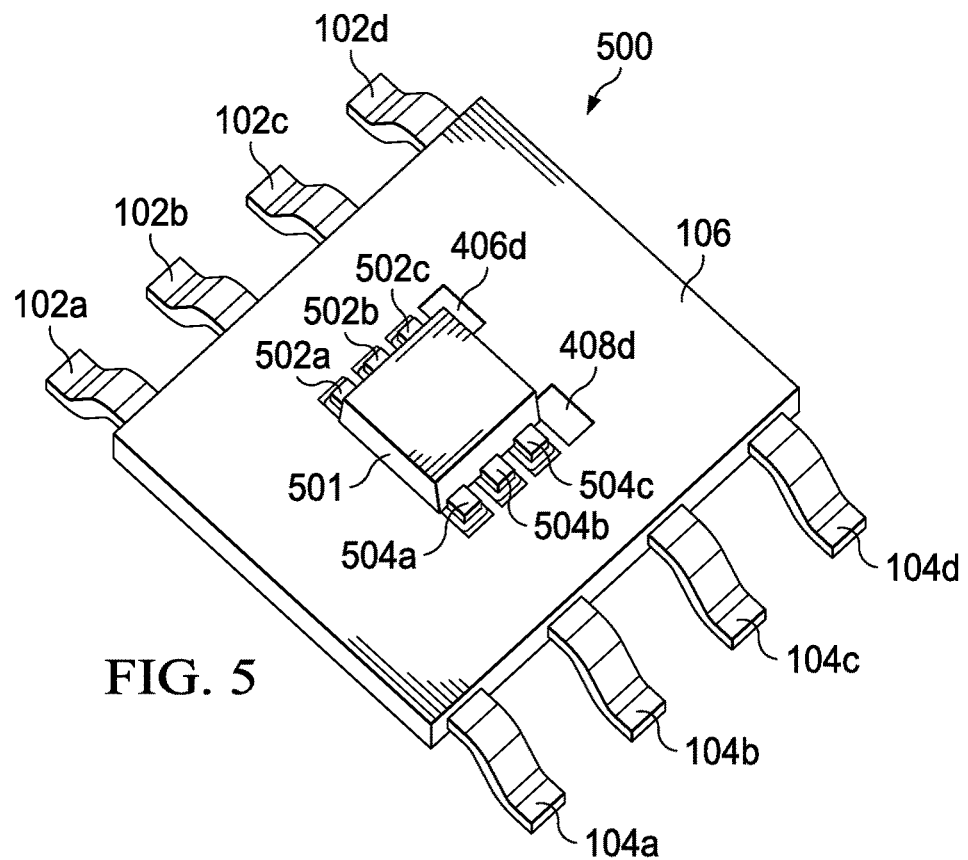
FIG. 5 is a perspective view of a multi-lead adapter with a non-conductive platform and an electronic component mounted on the non-conductive platform, in accordance with examples.

FIG. 5 is a perspective view of a multi-lead adapter 500 with a non-conductive platform 106 and an electronic component 501 mounted on the non-conductive platform 106, in accordance with examples. The electronic component 501 is not part of the multi-lead adapter 500. The multi-lead adapter includes the leads 102a-102d and 104a-104d encapsulated within the non-conductive platform 106, as described above. The electronic component 501 may be mounted on the non-conductive platform 106 by coupling (e.g., soldering) to one or more of the lead ends 406a-406d and/or 408a-408d (shown in FIG. 4). In the specific example of FIG. 5, the electronic component 501 is a dual in-line package with a footprint smaller than that of the multi-lead adapter. The electronic component 501 is configured to couple to a PCB, meaning that it has electrical connectors (e.g., leads 502a-502c and 504a-504c that extend from opposing surfaces of the electronic component 501) that have a shape, size, and position that generally facilitate mating with PCBs (although, as explained herein, the electronic component 501 may not be configured to couple to the particular PCB to which the multi-lead adapter couples). The electronic component 501 couples to the lead ends 406a-406c and 408a-408c. More specifically, the lead 502a of the electronic component 501 couples to the lead end 406a; the lead 502b couples to the lead end 406b; the lead 502c couples to the lead end 406c; the lead 504a couples to the lead end 408a; the lead 504b couples to the lead end 408b; and the lead 504c couples to the lead end 408c. The lead ends 406d and 408d do not couple to the electronic component 501 in this example. Although not expressly shown in FIG. 5, the leads 102a-102d and 104a-104d may couple to another device, such as a PCB, thus facilitating electronic communications between the electronic component 501 (more specifically, for example, a chip housed inside the electronic component 501) and the PCB. Such communications are facilitated despite the fact that the electronic component 501 has a footprint that is not compatible with the PCB.

Figure 6A:
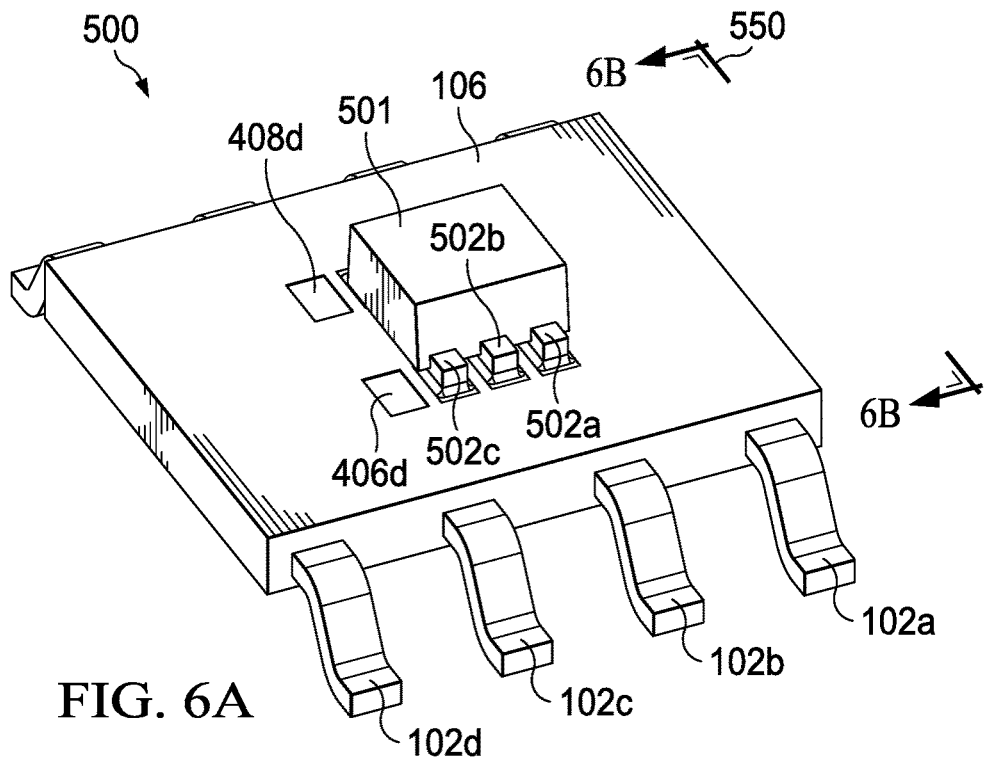
FIG. 6A is a perspective view of a multi-lead adapter with a non-conductive platform and an electronic component mounted on the non-conductive platform, in accordance with examples.

FIG. 6A is a perspective view of a multi-lead adapter 500 with a non-conductive platform 106 and an electronic component 501 mounted on the non-conductive platform 106, in accordance with examples. As explained with regard to FIG. 5, the electronic component 501 has leads 502a-502c that couple to the lead ends (not visible in FIG. 6A) exposed to the surface of the non-conductive platform 106. Lead ends 406d and 408d remain exposed, as shown.

Figure 6B:
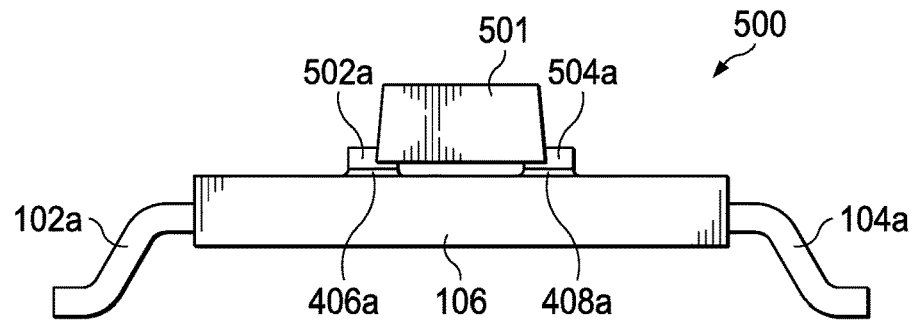
FIG. 6B is a front view of a multi-lead adapter with a non-conductive platform and an electronic component mounted on the non-conductive platform, in accordance with examples.

FIG. 6B is a front view of a multi-lead adapter 500 with a non-conductive platform 106 and an electronic component 501 mounted on the non-conductive platform 106, in accordance with examples. The front view is in the direction indicated by the arrow 550 depicted in FIG. 6A. As shown, the leads 502a, 504a of the electronic component 501 couple to the lead ends 406a, 408a exposed on the top surface of the non-conductive platform 106.

Figure 6C:
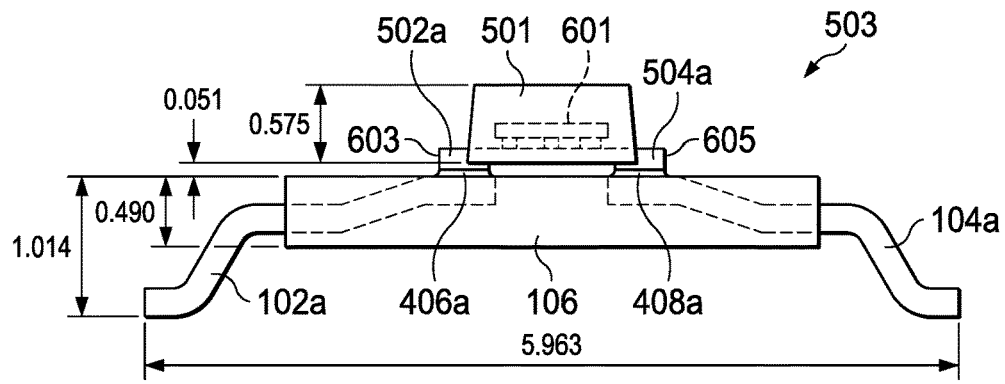
FIG. 6C provides a front view of a multi-lead adapter with multiple illustrative physical dimensions associated with the multi-lead adapter, in accordance with examples.

FIG. 6C provides a front view similar to that of FIG. 6B, but FIG. 6C additionally provides illustrative dimensions that may be used in an example package 503, for example an SOIC package. The package 503 includes leads 102a, 104a that have an end-to-end length of between 5 mm and 6 mm, with an illustrative length of approximately 5.963 mm. (For a PDIP package, this length may range between 10 millimeters and 11 millimeters. For a TSSOP package, this length may range between 6 and 7 mm. For an MSOP package, this length may range between 4.5 and 5.5 mm.)

The package 503 further includes a non-conductive platform 106 having a thickness of between 0.4 mm and 0.5 mm, with an example thickness of approximately 0.490 mm. The distance between the bottommost surface of the leads 102a, 104a and the top surface of the non-conductive platform 106 is between 1 mm and 2 mm, with an example distance of approximately 1.014 mm. The package 503 also includes the electronic component 501, which has a thickness of between 0.5 mm and 0.6 mm, with an example thickness of approximately 0.575 mm. As shown, the electronic component 501 may be a chip package that contains a die 601 coupled to the leads 502a, 504a using wirebonds, a flip-chip configuration, or any other suitable configuration. The lead ends exposed on the top surface of the non-conductive platform 106 may be raised above the top surface of the non-conductive platform 106 by a distance between 0.04 mm and 0.06 mm, with an example distance of approximately 0.051 mm. In addition, the distance between the ends 603, 605 of the leads 502a, 504a is less than the distance between the ends 607, 609 of the leads 102a, 104a. All dimensions may be varied as desired. Although the dimensions shown in FIG. 6C correspond to those of an SOIC, other dimensions may be considered to be consistent with SOIC specifications if those dimensions are still usable in applications calling for an SOIC footprint. The same is true for other footprints, such as PDIP, TSSOP, MSOP, etc.

Figure 7:
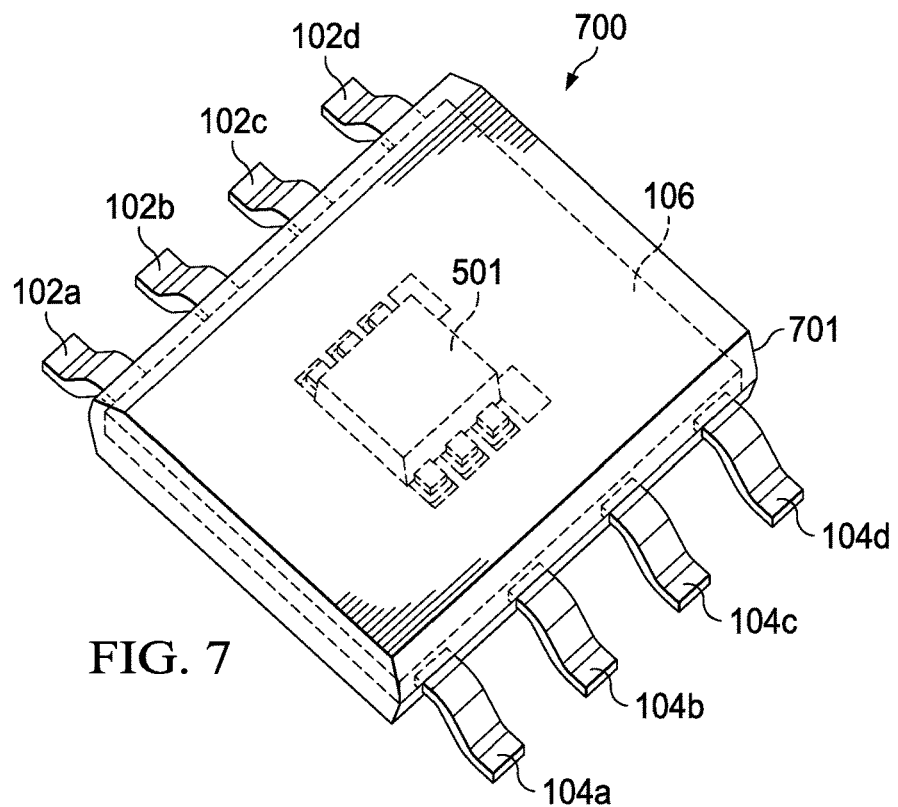
FIG. 7 is a perspective view of a multi-lead adapter coupled to an electronic component and encapsulated in a molding, in accordance with examples.

FIG. 7 is a perspective view of a package 700 including a multi-lead adapter coupled to an electronic component 501 and optionally encapsulated in a molding 701, in accordance with examples. More specifically, the package 700 includes the electronic component 501 mounted on a non-conductive platform 106 by coupling to one or more lead ends exposed to a surface of the non-conductive platform 106, as described above. The electronic component 501, the non-conductive platform 106, and portions of the leads 102a-102d and 104a-104d are encapsulated within the molding 701 (e.g., an epoxy material) to form the package 700. The leads 102a-102d and 104a-104d extend from opposing surfaces of the molding 701. In this manner, for example, a chip within the electronic component 501 is enabled to electronically communicate with a device (e.g., PCB) that is designed to couple only to packages having a footprint that matches that of the leads 102a-102d and 104a-104d.

Figure 8A:
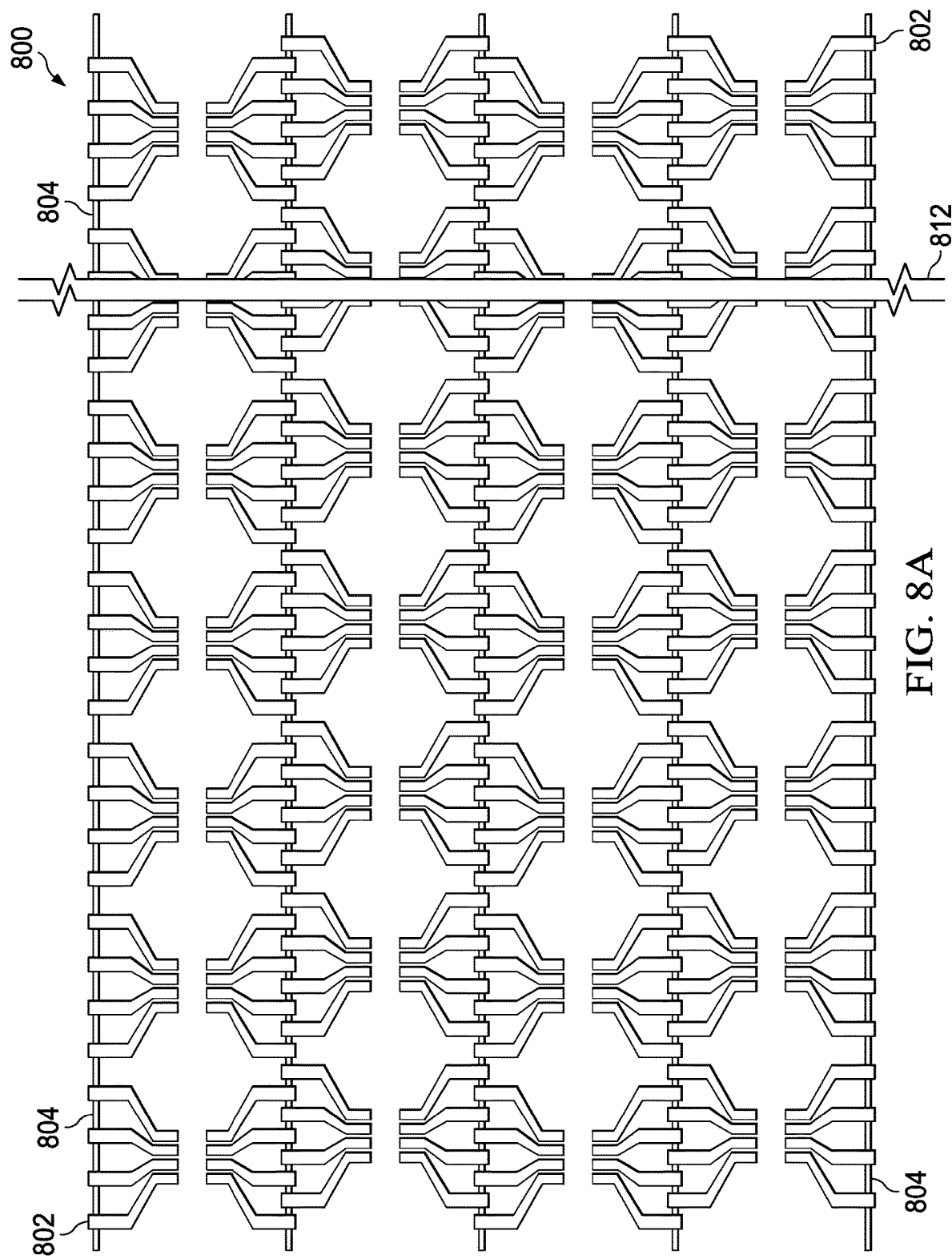
FIG. 8A depicts a top-down view of a strip of multi-lead adapters, in accordance with examples.

FIG. 8A depicts a top-down view of a strip of multi-lead adapters 800, in accordance with examples. The strip 800 may be formed by, e.g., a stamping process on a sheet of metal or metal alloy. The strip 800 includes multiple leads 802. In the example shown, each set of four leads 802 is sized, shaped, and positioned to form a multi-lead adapter, such as the multi-lead adapters described above. Numeral 812 is a discontinuity that indicates that the length of the strip 800 may be longer than specifically depicted in FIG. 8A. Multiple leads 802 are coupled together using dam bars 804.

Figure 8B:
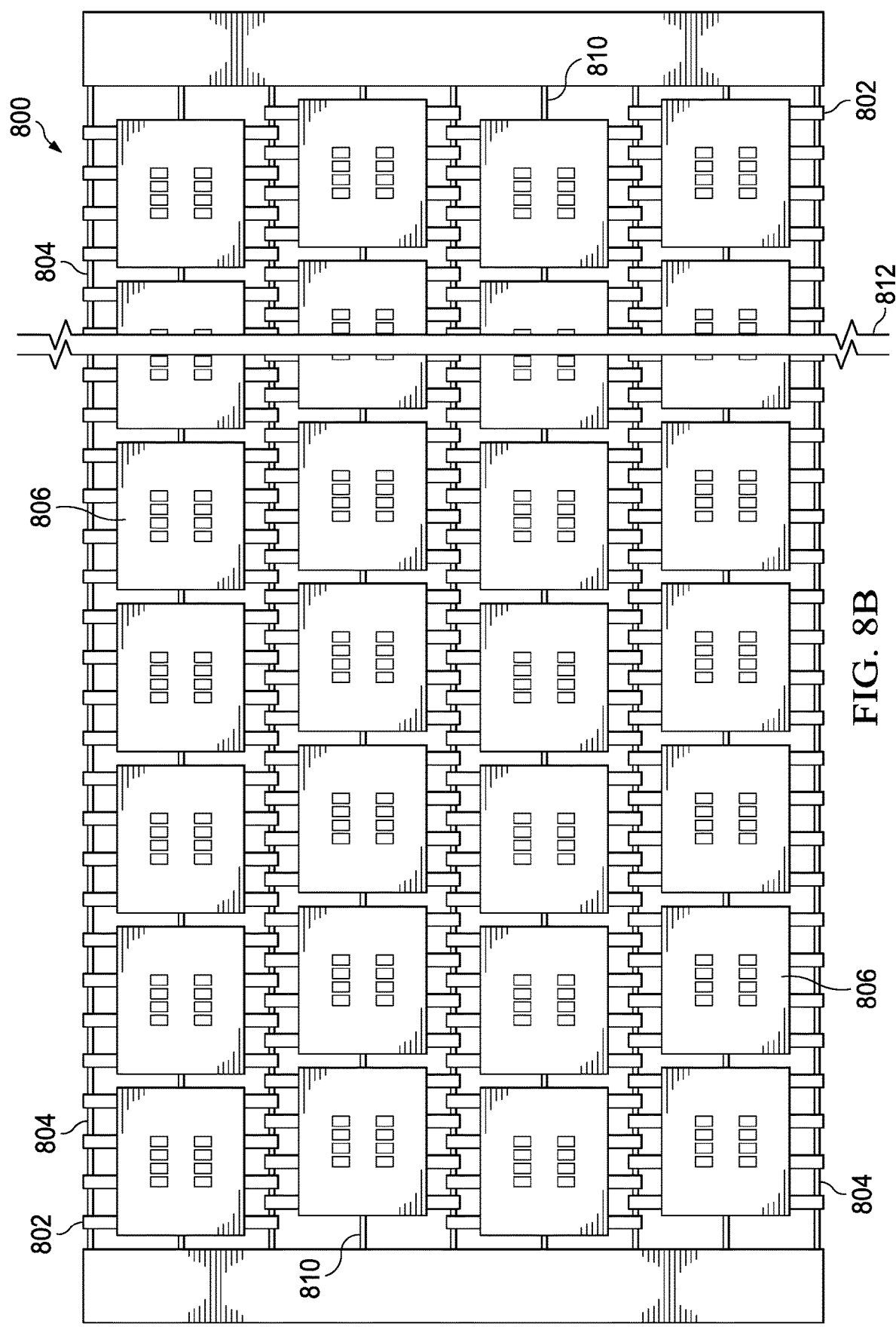
FIG. 8B depicts a top-down view of a strip of multi-lead adapters coupled to non-conductive platforms, in accordance with examples.

FIG. 8B depicts a top-down view of a strip of multi-lead adapters 800 coupled to non-conductive platforms 806, in accordance with examples. The non-conductive platforms 806 are formed by any suitable technique, e.g., a cast and mold process, additive manufacturing, dispensing, and machining. Each non-conductive platform 806 is coupled to another non-conductive platform 806 by a stub 810.

Figure 8C:
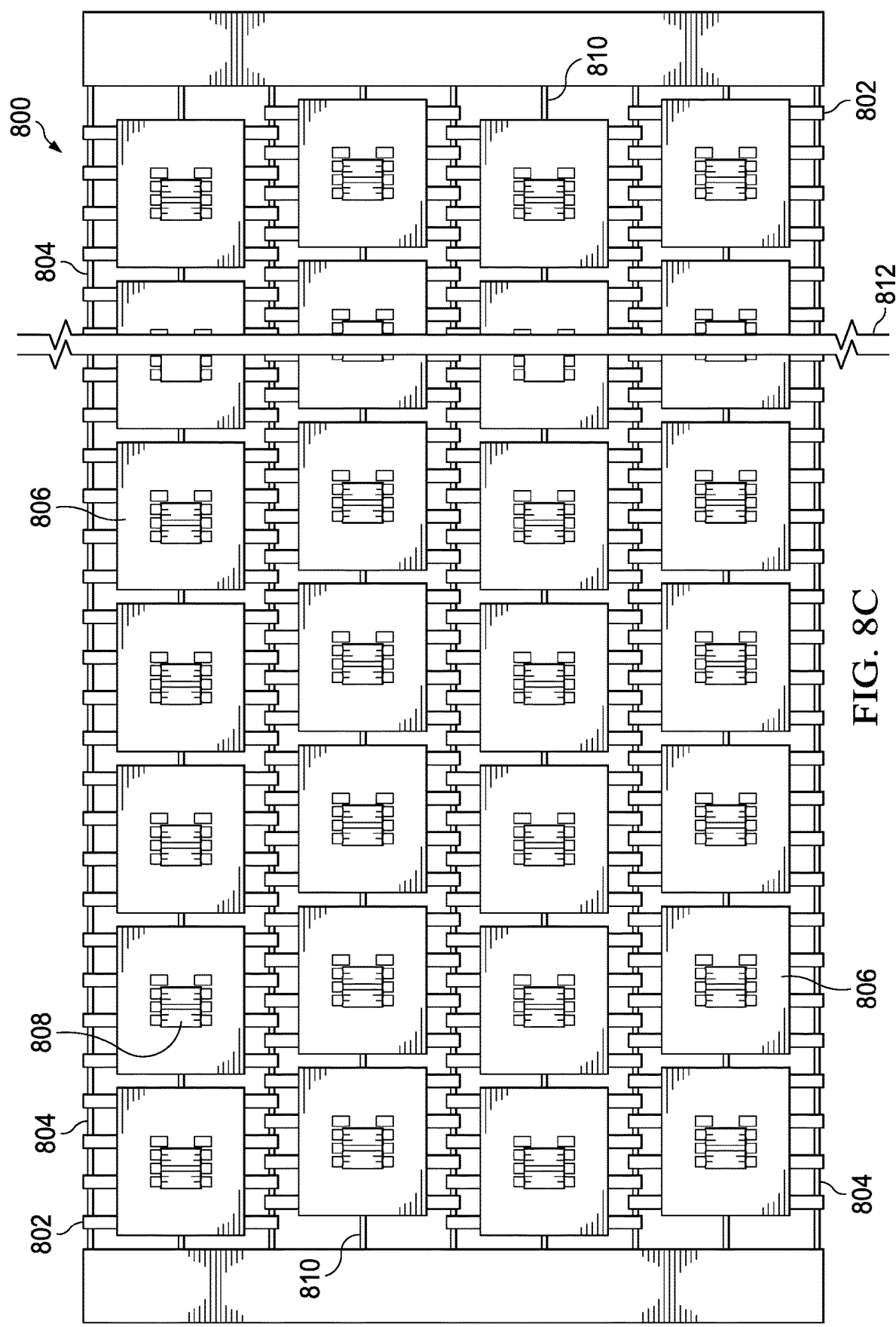
FIG. 8C depicts a top-down view of a strip of multi-lead adapters coupled to non-conductive platforms with electronic components mounted on the non-conductive platforms, in accordance with examples.

FIG. 8C depicts a top-down view of a strip of multi-lead adapters 800 coupled to non-conductive platforms 806 with electronic components 808 mounted on the non-conductive platforms 806, in accordance with examples. As previously explained, the electronic components 808 are electrically coupled to lead ends exposed to surfaces of the non-conductive platforms 806 using, e.g., solder or any other suitable conductive material. As also explained above, in some examples, the non-conductive platforms 806 are omitted, and in such examples, the electronic components 808 are coupled to the leads without the mechanical support benefit of the non-conductive platforms 806.

Figure 8D:
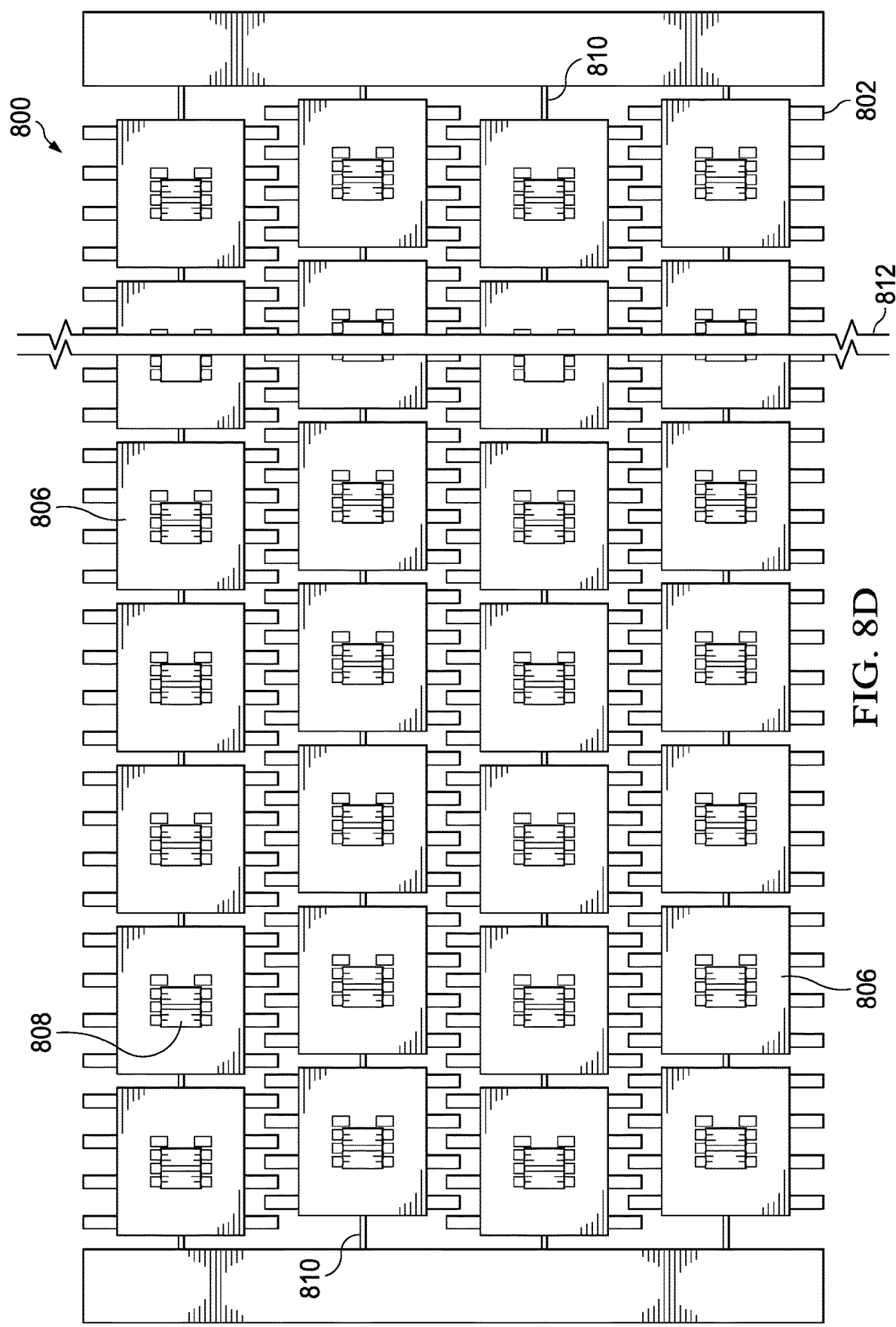
FIG. 8D depicts a top-down view of a singulated strip of multi-lead adapters coupled to non-conductive platforms with electronic components mounted on the non-conductive platforms, in accordance with examples.

FIG. 8D depicts a top-down view of a singulated strip of multi-lead adapters 800 coupled to non-conductive platforms 806 with electronic components 808 mounted on the non-conductive platforms 806, in accordance with examples. FIG. 8D differs from FIG. 8C in that the dam bars 804 are trimmed and removed. One advantage of the resulting configuration depicted in FIG. 8D is that a high-speed testing technique (e.g., a strip-testing technique) may be used to test the electrical connections between leads and the electronic components 808. For example, a tester may include a sufficient number of probes to simultaneously test multiple (e.g., dozens) devices, such as those depicted in FIG. 8D. To test multiple devices simultaneously, the devices should be held stationary to facilitate proper alignment with the tester probes, and this is accomplished at least in part by the non-conductive stubs 810. After the testing is complete, the devices passing inspection are marked accordingly, and the devices failing inspection are also marked accordingly, so that after the stubs 810 are trimmed and the devices singulated, the passing and failing devices are easily identifiable. After the high-speed testing is complete, the multi-lead adapters may optionally be encapsulated to form packages, either prior to or after trimming the stubs 810.

Figure 9:
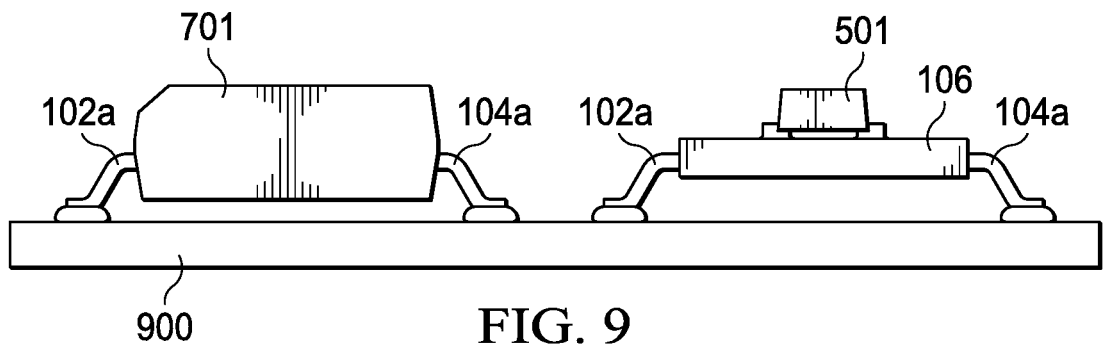
FIG. 9 depicts electronic components coupled to a printed circuit board (PCB) using multi-lead adapters, in accordance with examples.

FIG. 9 depicts electronic components coupled to a printed circuit board (PCB) 900 using multi-lead adapters, in accordance with examples. Specifically, FIG. 9 depicts an electronic component 501 mounted on a non-conductive platform 106 and coupled to leads, including leads 102a and 104a, that are coupled to the PCB 900, such as by soldering. FIG. 9 also depicts an encapsulated version of the same structures—namely, a package with molding 701 containing a device (e.g., a chip) electrically coupled to leads, including leads 102a and 104a, that in turn couple to the PCB 900. In practice, electronic components are packaged as depicted with molding 701. The structure to the right that includes the electronic component 501 mounted on the non-conductive platform 106 is depicted without molding to demonstrate illustrative contents of the package to the left including the molding 701.

Figure 10A:
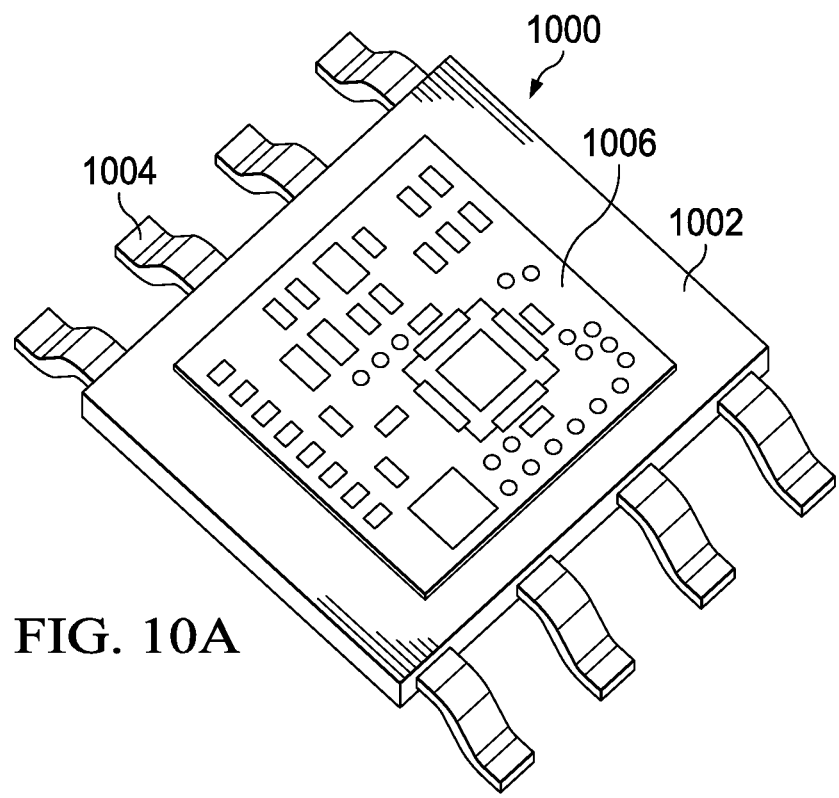
FIG. 10A depicts a PCB mounted on a non-conductive platform and coupled to a multi-lead adapter, in accordance with examples.
Figure 10B:
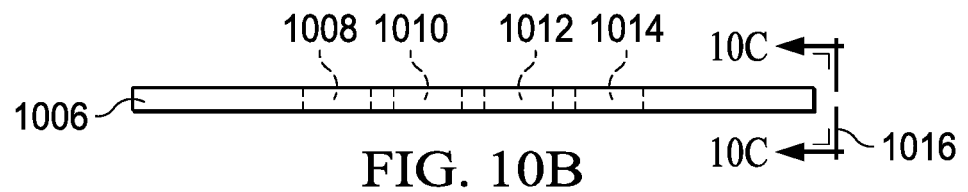
FIG. 10B depicts a side view of a PCB having multiple vias, in accordance with examples.
Figure 10C:
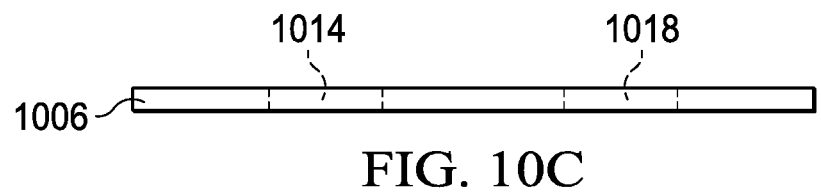
FIG. 10C depicts a front view of a PCB having multiple vias, in accordance with examples.
Figure 10D:
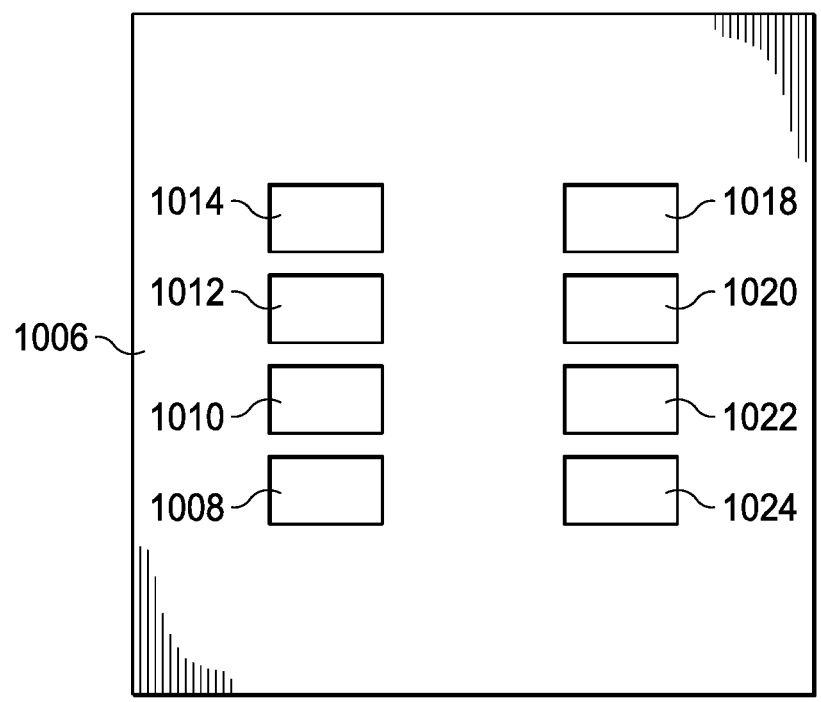
FIG. 10D depicts a bottom-up view of the PCB of FIG. 10C, in accordance with examples.

The discussion thus far primarily describes the use of a multi-lead adapter to enable the electrical coupling of a chip package to a PCB or other device that is not suited for coupling to that chip package. However, the scope of this disclosure is not limited to using multi-lead adapters in the context of chip packages. Other electrical components may be mounted on the multi-lead adapters instead—for example, other PCBs, passive electronic components (e.g., resistors, capacitors, inductors, transformers), sensors, multi-chip modules (MCMs), and any other suitable electronic components. Accordingly, FIG. 10A depicts a PCB 1006 mounted on a non-conductive platform 1002 of a multi-lead adapter 1000, in accordance with examples. The PCB 1006 contains one or more vias that facilitate electrical communication from the top surface of the PCB 1006, on which various electrical devices are mounted, to a bottom surface of the PCB 1006, which can couple to the leads 1004 of the multi-lead adapter 1000. FIG. 10B depicts a side view of the PCB 1006 having multiple vias 1008, 1010, 1012, and 1014, in accordance with examples. The vias 1008, 1010, 1012, and 1014 are filled with any suitable conductive material, such as copper or solder. Connections from circuitry on the top surface of the PCB 1006 to the top surfaces of the vias 1008, 1010, 1012, and 1014 may be accomplished in any suitable manner, for example using wirebonds or copper traces. FIG. 10C depicts a front view of the PCB 1006 as viewed from the direction indicated by the arrow 1016 in FIG. 10B. In FIG. 10C, the PCB 1006 is depicted as having multiple vias, including vias 1014 and 1018, in accordance with examples. FIG. 10D depicts a bottom-up view of the PCB 1006—that is, a view of the bottom surface of the PCB 1006. The vias 1008, 1010, 1012, 1014, 1018, 1020, 1022, and 1024 are depicted, although any number of vias may be used. These vias couple to the lead ends exposed on the top surface of the non-conductive platform 1002 when the PCB 1006 is mounted on the non-conductive platform 1002.

Figure 11:
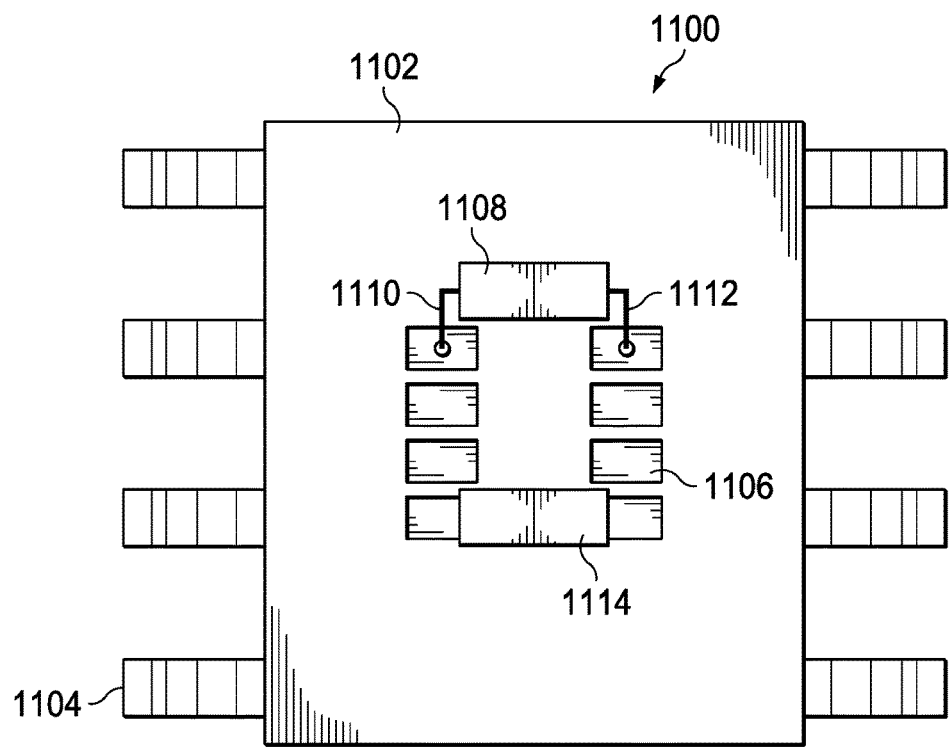
FIG. 11 depicts non-package devices mounted on a non-conductive platform and coupled to a multi-lead adapter, in accordance with examples.

FIG. 11 depicts a non-package device 1108 mounted on a non-conductive platform 1102 of a multi-lead adapter 1100 that includes leads 1104. The non-package device 1108 may be, for instance, a passive electronic component (e.g., resistor, capacitor, inductor, transformer), a sensor, a multi-chip module (MCM), or any other suitable device. The non-package device 1108 is mounted directly onto the non-conductive platform 1102 and is electrically coupled to one or more of the lead ends 1106 of the leads 1104 using electrical connections 1110, 1112 (e.g., wirebonds, copper traces). In other examples, a non-package device 1114 is mounted directly onto one or more lead ends 1106, as shown. Other techniques for mounting non-package devices are contemplated and included within the scope of this disclosure.

Figure 12:
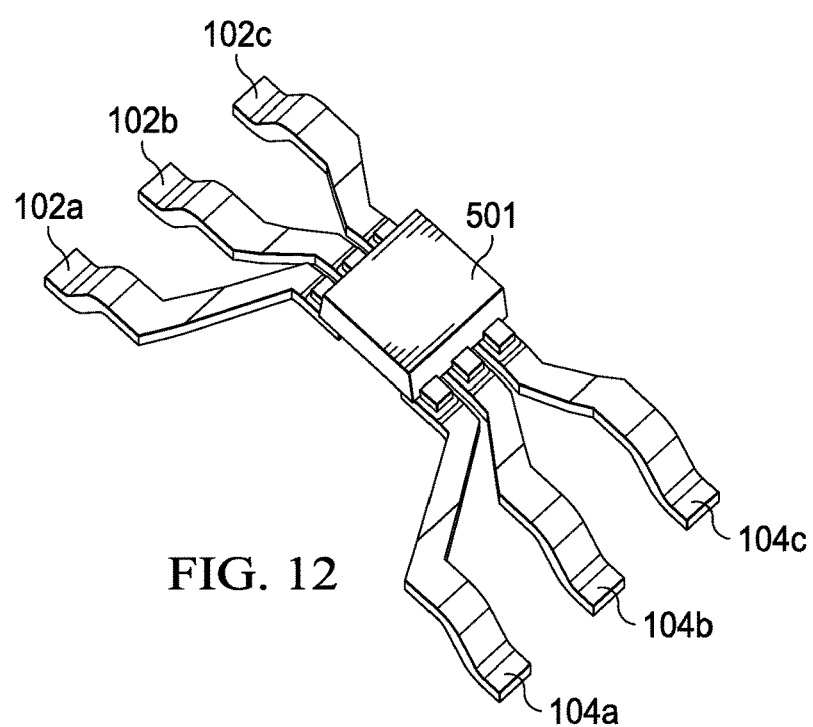
FIG. 12 depicts a multi-lead adapter that couples directly to an electronic component without the use of a non-conductive platform, in accordance with examples.

Most of the examples described thus far in this disclosure have assumed the use of a non-conductive platform to provide mechanical support for the electronic components mounted on the non-conductive platforms. However, as explained above, the non-conductive platforms described herein are optional and may be omitted. Accordingly, FIG. 12 depicts a multi-lead adapter that includes leads 102a-102d and 104a-104d and that couples directly to an electronic component 501 without the use of a non-conductive platform. After this coupling is accomplished, such a multi-lead adapter may be encapsulated using an epoxy or other non-conductive material to complete package fabrication.

In the foregoing discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. Similarly, a device that is coupled between a first component or location and a second component or location may be through a direct connection or through an indirect connection via other devices and connections. An element or feature that is "configured to" perform a task or function may be configured (e.g., programmed or structurally designed) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Unless otherwise stated, "about," "approximately," or "substantially" preceding a value means+/−10 percent of the stated value.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A device comprising:
 a packaged electronic component having multiple electrical connectors, and having a first footprint; and
 a multi-lead adapter comprising a plurality of leads arranged in parallel rows, each of one or more of the leads connected on a first end to a corresponding single one of the electrical connectors of the packaged electronic component, second ends of the plurality of leads configured to couple to a printed circuit board (PCB) and having a second footprint that has a different size than the first footprint, wherein the multi-lead adapter does not include a semiconductor die.

2. The device of claim 1, wherein the multi-lead adapter further comprises a non-conductive platform molded around portions of the plurality of leads and comprising multiple orifices, each exposing the first end of one of the plurality of leads.

3. The device of claim 2, wherein the packaged electronic component is mounted on the leads via the multiple orifices.

4. The device of claim 1, wherein the packaged electronic component is selected from the group consisting of:
 a passive electronic component;
 a multi-chip module (MCM); and
 a sensor.

5. The device of claim 1, wherein the second footprint is consistent with that of a small outline integrated circuit (SOIC) package.

6. The device of claim 1, wherein the second footprint is consistent with that of a package selected from the group consisting of:
 a plastic dual in-line package (PDIP);
 a thin shrink small outline package (TSSOP); and
 a micro small outline package (MSOP).

7. The device of claim 1, further comprising:
 a molding encapsulating the packaged electronic component and a portion of the multi-lead adapter.

8. A device comprising:
 a package including a first group of leads extending from the package and a die coupled to the first group of leads, the first group of leads forming a footprint smaller than that of a small outline integrated circuit (SOIC) package;
 a second group of leads, each coupled to a single one of the first group of leads, the second group of leads forming another footprint that is consistent with that of the SOIC package; and a molding encapsulating the package and a portion of each lead in the second group of leads to form an SOIC package; and a non-conductive platform including epoxy molding mechanically supporting the second group of leads;

wherein the molding also encapsulates the non-conductive platform.

9. The device of claim 8, wherein the non-conductive platform comprises multiple orifices exposing a second end of one of the second group of leads.

10. The device of claim 9, wherein the package is mounted on the second group of leads via the multiple orifices.

11. A package comprising:

a packaged device including a first group of leads extending from a first side of the packaged device and a second group of leads extending from a second side of the packaged device opposite the first side of the packaged device;

a third group of leads, each connected on a first end to a single lead of the first group of leads;

a fourth group of leads, each connected on a first end to a single lead of the second group of leads; and a non-conductive platform mechanically coupled to the third and fourth groups of leads, the packaged device mounted upon the platform; wherein a top surface of each of the third and fourth groups of leads are coplanar with a top surface of the non-conductive platform, and wherein a first distance between ends of the first group of leads and corresponding ends of the second group of leads is different than a second distance between second ends of the third group of leads and corresponding second ends of the fourth group of leads.

12. The package of claim 11, wherein the second distance ranges between 5.0 millimeters and 6.0 millimeters.

13. The package of claim 11, wherein the second distance ranges between 10 millimeters and 11 millimeters.

14. The package of claim 11, wherein the second distance ranges between 6 millimeters and 7 millimeters.

15. The package of claim 11, wherein the second distance ranges between 4.5 millimeters and 5.5 millimeters.

16. The package of claim 11, wherein the packaged device is a chip package.

17. The package of claim 11, wherein the packaged device is selected from the group consisting of:

a passive electronic component;

a printed circuit board (PCB); a sensor; and a multi-chip module (MCM).

18. The package of claim 11, wherein the non-conductive platform includes multiple orifices through which first ends of corresponding ones of the third group of leads connects to corresponding ones of the first group of leads and through which first ends of corresponding ones of the fourth group of leads connects to corresponding ones of the second group of leads.

19. The package of claim 11, further comprising:

a molding encapsulating the packaged device, the first group of leads, the second group of leads, and the non-conductive platform, and encapsulating portions of the third group of leads and the fourth group of leads.

* * * * *